(12) United States Patent
Doan et al.

(10) Patent No.: US 7,675,465 B2
(45) Date of Patent: Mar. 9, 2010

(54) SURFACE MOUNTABLE INTEGRATED CIRCUIT PACKAGING SCHEME

(75) Inventors: Chinh Huy Doan, Santa Clara, CA (US); Mohammed Ershad Ali, San Jose, CA (US)

(73) Assignee: Sibeam, Inc., Sunnyvale, CA (US)

( * ) Notice: Subject to any disclaimer, the term of this patent is extended or adjusted under 35 U.S.C. 154(b) by 225 days.

(21) Appl. No.: 11/752,083

(22) Filed: May 22, 2007

(65) Prior Publication Data
US 2008/0291115 A1    Nov. 27, 2008

(51) Int. Cl.
*H01Q 1/38* (2006.01)
(52) U.S. Cl. ............................................. 343/700 MS
(58) Field of Classification Search .......... 343/700 MS, 343/702, 778; 342/70, 175
See application file for complete search history.

(56) References Cited

U.S. PATENT DOCUMENTS

| | | | |
|---|---|---|---|
| 5,798,567 A | 8/1998 | Kelly et al. | |
| 5,995,047 A * | 11/1999 | Freyssinier et al. | ... 343/700 MS |
| 6,770,955 B1 | 8/2004 | Coccioli et al. | |
| 7,116,202 B2 * | 10/2006 | Alexopoulos et al. | ....... 336/200 |
| 7,307,596 B1 * | 12/2007 | West | ........................... 343/778 |
| 2002/0036345 A1 | 3/2002 | Iseki et al. | |
| 2004/0041732 A1 * | 3/2004 | Aikawa et al. | ........ 343/700 MS |
| 2006/0017157 A1 | 1/2006 | Yamamoto et al. | |
| 2006/0033664 A1 | 2/2006 | Soler et al. | |
| 2006/0250298 A1 * | 11/2006 | Nakazawa et al. | ............. 342/70 |
| 2006/0250308 A1 * | 11/2006 | Pinel et al. | ............ 343/700 MS |
| 2007/0159380 A1 * | 7/2007 | Nagaishi et al. | ............... 342/70 |
| 2008/0272857 A1 * | 11/2008 | Singh | ........................ 333/161 |

FOREIGN PATENT DOCUMENTS

EP    2 071 663 A    6/2009

OTHER PUBLICATIONS

European Search Report for European Patent Application No. 08167064.8, dated 15 Oct. 2009, 7 pgs.

\* cited by examiner

*Primary Examiner*—Huedung Mancuso
(74) *Attorney, Agent, or Firm*—Blakely, Sokoloff, Taylor & Zafman LLP

(57) ABSTRACT

An integrated circuit (IC) package is disclosed. The IC package includes a substrate having top, middle and bottom layers, an array of millimeter-wave antennas embedded on the top layer of the substrate and a monolithic microwave integrated circuit (MMIC) mounted on the bottom layer of the substrate. In one embodiment, the second level interconnect for surface-mounting on a printed circuit board (PCB) is provided on the bottom layer of the substrate.

18 Claims, 5 Drawing Sheets

SURFACE MOUNTABLE INTEGRATED CIRCUIT PACKAGING SCHEME

FIELD OF INVENTION

An embodiment of the invention relates to integrated circuit packages, and more specifically, to millimeter wave integrated circuit packages.

BACKGROUND

Millimeter wave systems that perform beam forming and steering typically include numerous antenna elements, integrated circuits and interconnects. Such systems are the foundation of a viable mechanism to provide high data rate short-range wireless connectivity for consumer applications. In order to achieve performance and cost points, a prevalent challenge is to develop an integration platform package that is compatible with volume manufacturing and assembly processes.

Such an integrated package is expected to accommodate a variety of functions as the level of integration increases. These functions include providing low-loss resonance-free mm-wave signal paths, embedding of multi-layer antenna elements and their feed network, integrating local oscillator (LO), intermediate frequency (IF) distribution and passive circuits and incorporating control and bias layers among others.

In a typical scenario where a millimeter-wave antenna is to be integrated with an integrated circuit (IC), both the antenna and the IC reside on the top layer of a substrate to ensure acceptable performance. This approach encounters problems when there are many antenna elements that need to be individually driven by distinct RF ports located on one or more ICs. First, routing congestion will limit the number of elements.

Moreover, the package will be large as ICs and antennas have to be located on the same surface with enough clearance. As the size of the package increases, the cost will increase, and in some cases, the substrate may even become too large to be manufactured. Finally, heat removal from the ICs would be difficult.

SUMMARY

According to one embodiment, an integrated circuit (IC) package is disclosed. The IC package includes a substrate having top, middle and bottom layers, an array of millimeter-wave antennas embedded on one layer (e.g., the top layer) of the substrate and a monolithic microwave integrated circuit (MMIC) mounted on another, different layer (e.g., the bottom layer) of the substrate.

According to another embodiment, a system is disclosed. The system includes an integrated circuit (IC) package including a substrate having top, middle and bottom layers, an array of millimeter-wave antennas embedded on one player (e.g., the top layer) of the substrate and a monolithic microwave integrated circuit (MMIC) mounted on another layer (e.g., the bottom layer) of the substrate. A printed circuit board (PCB) is mounted on this second layer of the substrate.

DESCRIPTION OF THE DRAWINGS

The invention may be best understood by referring to the following description and accompanying drawings that are used to illustrate embodiments of the invention. In the drawings.

DETAILED DESCRIPTION

A surface mountable packaging scheme for the integration of the radiating and integrated circuit elements of a millimeter wave module is described. According to one embodiment, antennas are built into the top layers of a substrate. A monolithic microwave integrated circuit (MMIC) and a Ball grad array (BGA) are attached to the bottom side of the substrate.

An approach to solve or alleviate most of the above-described problems is to use a double-sided package where the antennas are located on the top and the ICs are located on the bottom of the package substrate. Therefore, a mechanism to implement a double-sided packaging that enables a high-level of integration of millimeter-wave functions with adequate performance is described.

In the following description, numerous details are set forth. It will be apparent, however, to one skilled in the art that embodiments of the present invention may be practiced without these specific details. In other instances, well-known structures, devices, and techniques have not been shown in detail, in order to avoid obscuring the understanding of the description. The description is thus to be regarded as illustrative instead of limiting.

Reference in the specification to "one embodiment" or "an embodiment" means that a particular feature, structure, or characteristic described in connection with the embodiment is included in at least an embodiment of the invention. The appearances of the phrase "in one embodiment" in various places in the specification are not necessarily all referring to the same embodiment.

Figure 1:
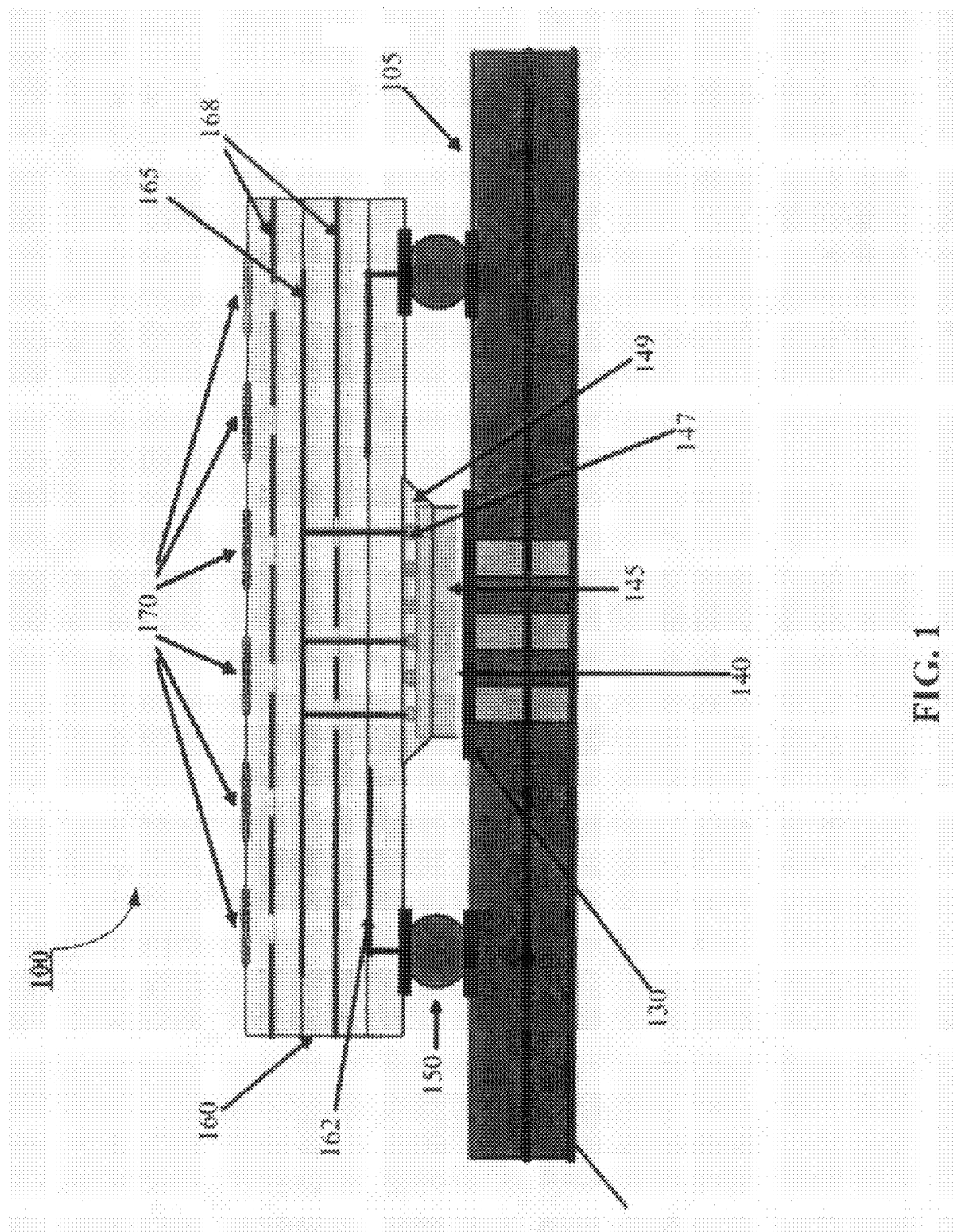
FIG. 1 illustrates one embodiment of a double-sided surface mount integrated millimeter wave package.

FIG. 1 illustrates one embodiment of a double-sided surface mount millimeter wave integrated system 100. System 100 includes a multi-layer substrate 160 mounted on a printed circuit board (PCB) 105. Substrate 160 includes dielectric layers and metal layers located at the interface of the two dielectric layers. As described herein, any reference to the term "layer" by itself denotes "metal layer." In one embodiment, substrate 160 is suitable for mass production via High Temperature Co-Fired Ceramics (HTCC) or Low Temperature Co-Fired Ceramics (LTCC) alumina, although other substrate types such as, for example, laminate-based or build-up organic can also be used. Further, in one embodiment, substrate 160 includes no cavities or special features, such as side-wall metallization, etc.

In one embodiment, an antenna array 170 is embedded on the top of the substrate. In one embodiment, antenna array 170 has metal patterns on multiple layers. In one embodiment, the top two layers are used for antenna array 170. The antenna array 170 feeds and their distribution are realized using several internal layers of substrate 160. At the bottom of substrate 160, one or more MMICs 145 are flip-chip mounted to substrate 160. In alternative embodiments, other mountings and configurations are used, such as, for example, face-up (bottom side of chip bonded to substrate) mounting with wire-bonds as interconnects between chip and substrate, wherein such a case, the chip is placed face-up in a cavity in order to shorten the wire-bond length, which is critical for millimeter wave operation. If a cavity is not desired in the package substrate, the chip can be lapped thin. However, too thin of a chip may lead to handling and assembly issues.

Transmission lines 165 and ground planes 168 are included within substrate 160. Transmission lines 165 transport millimeter-wave signals between antenna in the antenna array 170 and the one or more MMICs 145.

According to one embodiment, each of the antenna array 170 elements has a corresponding millimeter-wave port on one of the MMICs 145. A flip-chip bump 147 couples a corresponding antenna array 170 element to MMIC 145, with under-fill 149. Accordingly, millimeter-wave signals starting from the MMICs 145 travel to an intermediate layer of substrate 160, where they are distributed to respective antenna feed points 165 and are eventually coupled to the antennas in the antenna array 170.

Other analog signals (e.g., LO and IF signals, bias and control signals) are routed using some of the bottom layers of the substrate 160 via analog signal routing 162. Ball grid array BGA balls 150 are attached to the bottom of substrate 170 to enable the package to be surface mounted on PCB 105. In one embodiment, the size of the BGA balls 150 is chosen to ensure that combined height of the flip-chip mounted MMIC die 145 is less than the BGA ball 150 height.

In a further embodiment, during the surface-mount operation, when the BGA balls 150 reflowed, the die 145 acts as a hard-stop and prevents the BGA balls 150 from fully collapsing. In one embodiment, a thermally compliant pad is placed under the die to ensure low thermal resistance contact to PCB 105. In yet a further embodiment, a solderable pad 130 is placed on PCB 105 underneath die 145, and the back-side of die 145 is metalized with a metal component 140. Thus, the back-side of die 145 can be soldered during surface mounting to ensure a good thermal connection of the die 145 to the PCB 105.

According to one embodiment, system 100 includes a configuration of a multilayer substrate 160 for the integration of an array of antennas 170 on the top side and the MMICs 145 on the bottom side; a configuration of the bottom side of the substrate 160 for surface-mount assembly; and a configuration for the mounting of the package on PCB 105.

Multi-Layer Substrate Configuration

Figure 2:
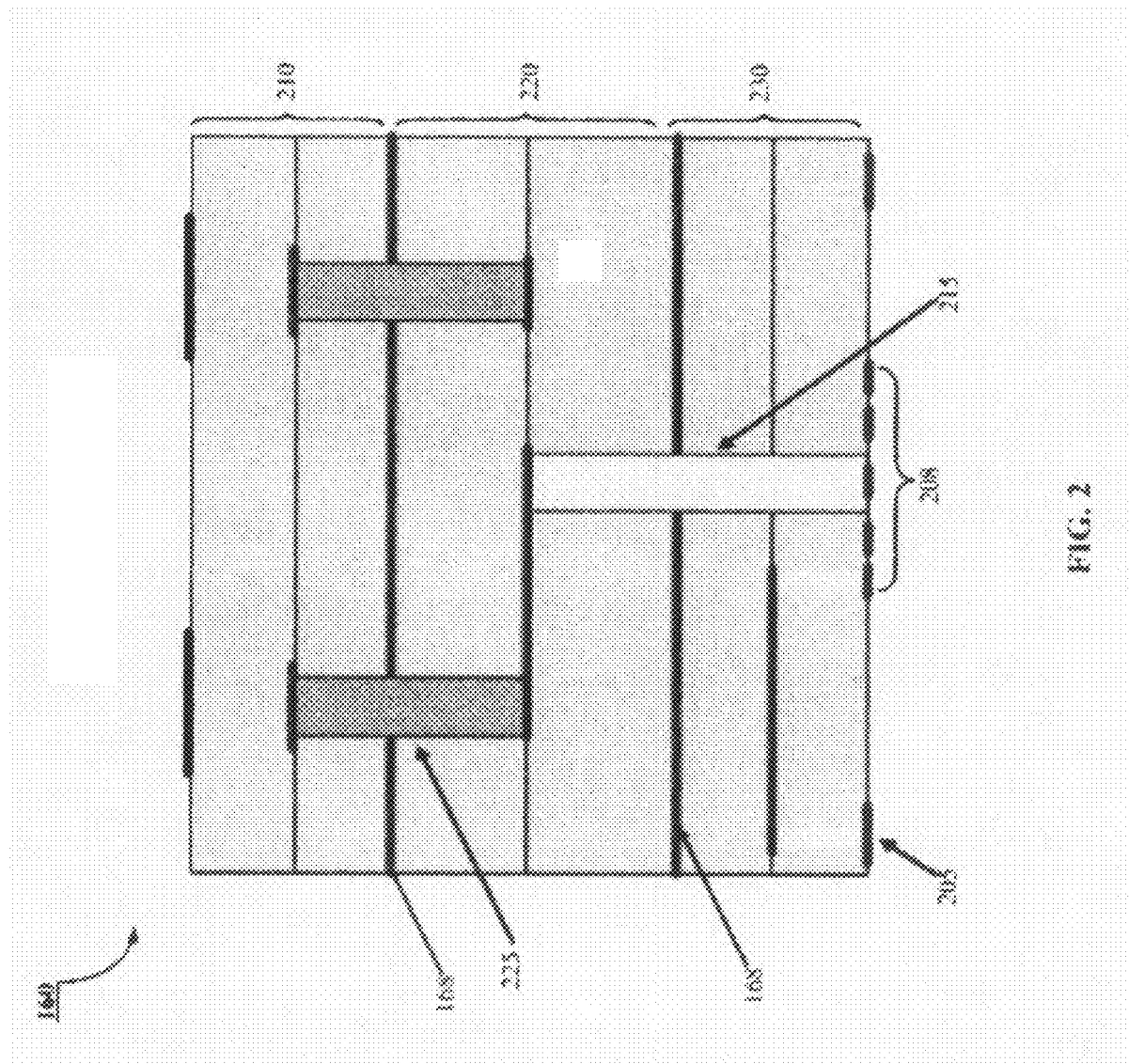
FIG. 2 illustrates one embodiment of a substrate.

FIG. 2 illustrates a cross-sectional view of one embodiment of a substrate 160. Based on the major functions they embed, the layers are divided into three groups, top 210, middle 220 and bottom 230, separated by ground planes 168. In one embodiment, the top layers 210 are assigned for planar antenna elements. Multiple layers are often needed to implement techniques such as patch stacking to enhance the performance of the antenna. Note that in alternative embodiments single layers may be used for the planar antenna elements. The dielectric layer thicknesses may be determined from antenna design considerations. The top ground plane 168 isolates the antenna layers 210 from the rest of the package, thereby providing immunity from electromagnetic interference.

The middle layers 220 are used for the distribution of millimeter-wave signals to the antennas. In one embodiment, the antenna elements do not share feed-lines and the number of millimeter-wave feed-lines is the same as the number of elements in the antenna array. In one embodiment, in order to efficiently distribute a large number of feed-lines in a compact manner, one or more layers are used. The ground planes 168 provide shielding from circuitry on other layers. According to one embodiment, metallization other than signal lines is kept to a minimum on these layers for a homogeneous electromagnetic environment. In one embodiment, the keepout region from the signal trace is a design parameter that depends on factors such as trace-width and substrate layer thicknesses etc. In other embodiments, other factors may impact this design parameter. In order to improve single TEM mode propagation, strip lines with ground via fencing may be used for the signal lines, where fencing refers to placing vias at a certain distance on both sides of the signal trace as it is routed. The distance from trace to ground via and the spacing between vias are design parameters.

The bottom layers 230 are used for DC, control and low-frequency analog signals. In one embodiment, a highly-integrated MMIC 145 requires a large number of DC and control lines in addition to the LO and IF signal lines. To accommodate this, and to compensate for the bottom-most layer 230 crowded with the die 145 and the BGA 150, two or more layers may be used. In one embodiment, the package is intended for surface-mount applications, and thus the layers see the electrical characteristic of the PCB underneath the package which are not known beforehand. Thus, due to the lack of a well-defined electromagnetic boundary, millimeter-wave signal routing should be minimal on the bottom layers.

As discussed above, the millimeter-wave signal distribution has been kept in the middle layers 220 shielded by ground planes 168. In addition, multiple layers are added on the top and the bottom to accommodate other functions. This results in the substrate 160 being relatively thick on the scale of millimeter-wave wavelength. Thus, the millimeter-wave signals have to traverse quite a distance vertically as they go from one layer to the other. In one embodiment, simple via transition, or even traditional quasi-coaxial via transition, are not sufficient to suppress the resonances, higher-order modes and reflections that would be present in a long vertical interconnection.

Thus, in one embodiment, a compensated vertical interconnect scheme is implemented as a solution to this vertical interconnection problem. In the vertical interconnection scheme, the millimeter wave signal is routed down to flip chip pads 208 on a compensated vertical interconnect 215, which is an inner metal layer of the substrate.

In a further embodiment, a compensation structure is integrated into the layer transition structure. In such an embodiment, the placement, size and shape of the compensation structure are determined through a modeling process. In a further embodiment, the modeling process includes a method of optimization that makes use of a three-dimensional (3D) electromagnetic tool (e.g., a High Frequency Structure Simulator (HFSS) from Ansoft Corporation), and a circuit simulator (e.g., an advanced design system (ADS) from Agilent Technologies, Inc.).

According to one embodiment, compensated vertical interconnect is placed at or very close to every millimeter-wave port of the MMIC on the bottom. In other embodiments, similar vertical interconnects are used in antenna-feed network in feeding schemes where the millimeter-wave signals have to be routed from the middle to the top layers.

Substrate Bottom-Side Configuration

According to one embodiment, the bottom side of substrate 160 is configured as both the MMIC 145 and the second level interconnect side of the package. One or more MMICs 145 are flip-chip mounted to substrate 160 using standard flip-chip assembly techniques. As discussed above, other mounting techniques can be used. Due to their low electrical parasitics, flip-chip interconnects can provide adequate performance at mm-wave frequencies. In a further embodiment, die 145 is cavity mounted in order to obtain reduced wire-bond length for high-frequency operation. Another advantage of flip-chip mounting in the configuration is that the back-side of die 145 is exposed and available for efficient heat removal.

As the second level interconnect, a BGA type interface is used where balls 150 are placed around the perimeter of substrate 160 in one or more rows. In one embodiment, all millimeter wave processing, such as frequency translation, multiplication and phase-shifting, is implemented in MMIC 145, making the millimeter signals completely contained within the package except for radiation through antennas. In this case, only low frequency IF, LO and reference signals are to be provided from sources external to the package.

Figure 3:
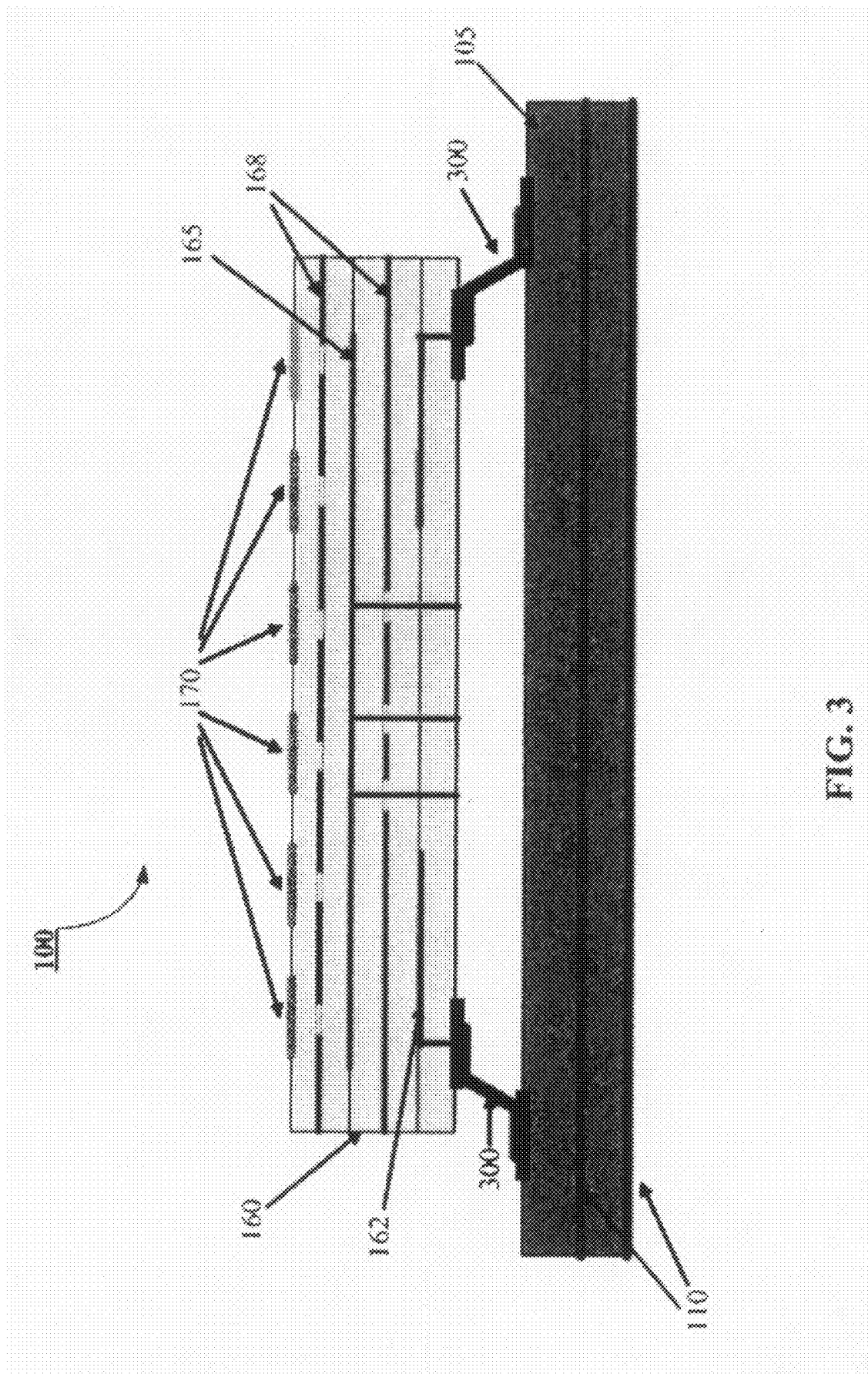
FIG. 3 illustrates another embodiment of a double-sided surface mount millimeter integrated wave package.

In such a scenario, the second level interconnect has adequate performance at low frequencies, thus, relaxing its specifications. As a result, other types of interconnects may be implemented. FIG. 3 illustrates an embodiment of system 100 where leads 300 couple substrate 160 to PCB 105, rather than BGA balls 150.

Package Mounting Configuration

In one embodiment, the flip-chip mounted die 145 and BGA balls 150 are on the surface-mount side of the package, the package is ready to be attached to PCB 105. There are several ways that the package can be attached to PCB 105. As illustrated in FIG. 1, the metalized back-side 140 of die 145 mates with a solderable mounting pad 130 on PCB 105 during the surface-mounting operation. The size of the gap between the die and the mounting pad is to be considered. For good solder connection at BGA, the solder balls 150 need to collapse sufficiently during reflow. As die 145 acts as a hard stop against PCB 105, too little of a gap prevents the solder balls 150 from forming a good connection.

Figure 4:
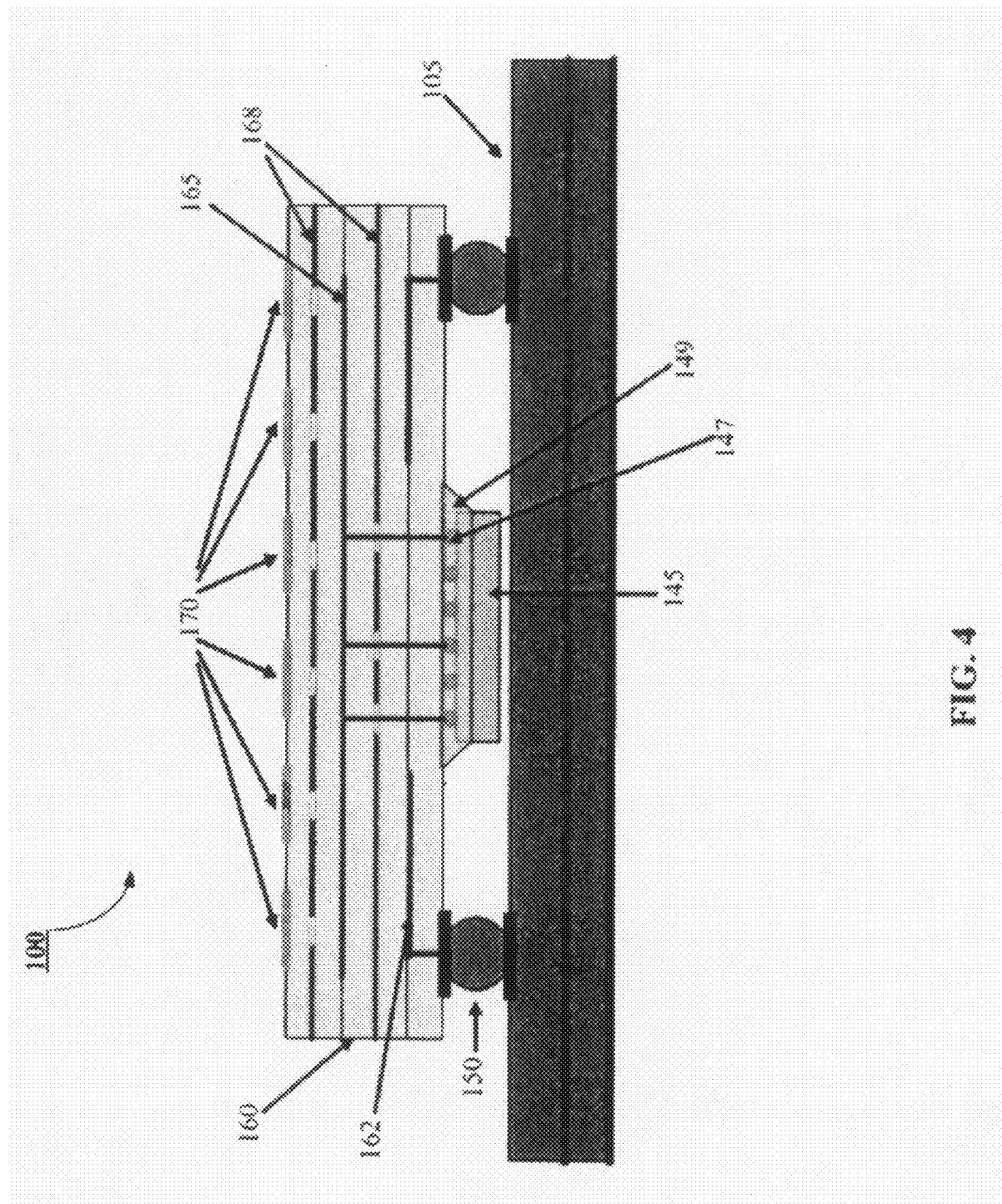
FIG. 4 illustrates yet another embodiment of a double-sided surface mount millimeter integrated wave package.

In another embodiment, the package is attached to PCB 105 while the die 145 does not mate with PCB 105 during surface mounting. FIG. 4 illustrates such an embodiment of system 100. As shown in FIG. 4, it is important to prevent the BGA solder ball 150 from collapsing to a level where die 145 may contact PCB 105. In one embodiment, this is achieved by either using solid core BGA balls or a few smaller non-reflowable balls whose size has to be such that there is a gap between the die and the PCB.

Figure 5:
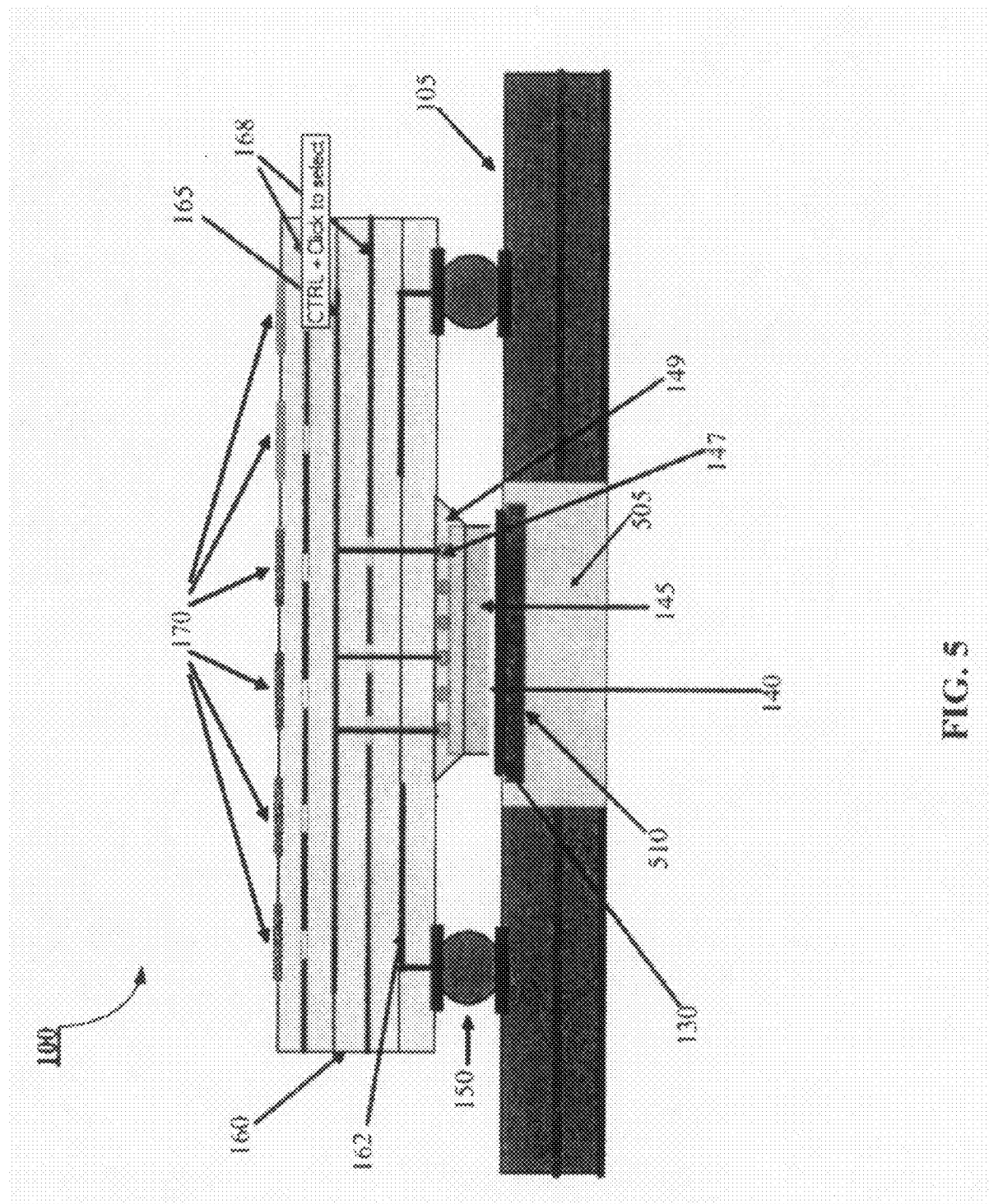
FIG. 5 illustrates still another embodiment of a double-sided surface mount millimeter integrated wave package.

In a third method of attachment, PCB 105 includes a through cutout larger than the size of die 145. FIG. 5 illustrates such an embodiment of system 100. As shown in FIG. 5, a cutout 505 would be located right underneath the die. During surface mounting, when the BGA balls 150 are collapsing, die 145 would slip into the cutout. Since there is no need for a gap between die 145 and PCB 105, this configuration would allow the use of smaller BGA balls 150. The die 145 back-side would be exposed through cutout 505 and a thermal connection can be established, for example, by using a heat-sink.

In another embodiment, the die 145 back-side is not metalized for thermal connection. In such an embodiment, a thin metal paddle 510 can be glued to the backside using thermal adhesive and metal paddle 510 can then be attached to PCB 105 to establish a low-resistance interface.

The above-described system describes a scheme for making a highly integrated millimeter-wave package based on a thick multi-layer substrate, where antennas are integrated into the top layers of the substrate and a MMIC and BGA for surface mounting are attached to the bottom. The scheme overcomes the hurdles of fabricating such an unconventional packaging, and can be implemented using volume manufacturing processes.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The foregoing description has been directed to specific embodiments. It will be apparent to those with ordinary skill in the art that modifications may be made to the described embodiments, with the attainment of all or some of the advantages. Therefore, it is the object of the appended claims to cover all such variations and modifications as come within the spirit and scope of the invention.

What is claimed is:

1. An integrated circuit (IC) package comprising:
   a substrate having first, second and third sets of one or more layers, including:
   an array of millimeter-wave antennas embedded the first set of layers of the substrate, comprising:
      first antennas embedded on a first layer of the first set of layers;
      second antennas embedded on a second layer of the first set of layers;
   a monolithic microwave integrated circuit (MMIC) mounted on one of the third set of layers of the substrate; and
   ball grid array (BGA) balls mounted on the third set of layers to mount the substrate to a printed circuit board.

2. The package of claim 1 wherein the MMIC comprises one or more ports corresponding to an antenna in the array.

3. The package of claim 2 further comprising antenna feed points embedded in one or more of the second set of layers of the substrate.

4. The package of claim 3 further comprising an interconnection to carry signal from the MMIC to the feed points.

5. The package of claim 4 wherein the interconnection comprises a compensation structure to reduce the parasitic effect of the transition from a layer in the third set of layers through to the second set of layers.

6. The package of claim 4 further comprising analog signal lines embedded in third set of layers.

7. The package of claim 6 further comprising leads mounted on the third set of layers to mount the substrate to a printed circuit board (PCB).

8. The package of claim 6 further comprising a pad mounted underneath the MMIC die to mount on the PCB.

9. The package of claim 8 wherein the backside of the MMIC die is metalized.

10. A system comprising:
    an integrated circuit (IC) package comprising:
    a substrate having first, second and third sets of one or more layers, including:
    an array of millimeter-wave antennas embedded the first set of layers of the substrate, comprising:
       first antennas embedded on a first layer of the first set of layers;
       second antennas embedded on a second layer of the first set of layers; and a monolithic microwave integrated circuit (MMIC) mounted on one of the third set of layers of the substrate;

a printed circuit board (PCB) mounted on the third set of layers of the substrate; and ball grid array (BGA) balls mounted on the third set of layers to mount the substrate to a printed circuit board.

11. The system of claim 10 wherein the MMIC comprises one or more ports corresponding to an antenna in the array.

12. The system of claim 11 wherein the package further comprises antenna feed points embedded in the one or more of second set of layers of the substrate.

13. The system of claim 12 further comprising an interconnection to carry signal from the MMIC to the feed points.

14. The system of claim 10 further comprising leads mounted on at least one of the third set of layers to mount the substrate to a the PCB.

15. An integrated circuit (IC) package comprising:

a substrate having first, second and third sets of one or more layers, including:

an array of millimeter-wave antennas embedded on the first set of layers of the substrate;

a monolithic microwave integrated circuit (MMIC) mounted on one of the third set of layers of the substrate; and a ball grid away (BGA) balls mounted on the third set of layers to mount the substrate to a printed circuit board (PCB).

16. The package of claim 15 wherein the substrate further comprises a first ground plane embedded between the first and second sets of one or more layers and a second ground plane embedded between the second and third sets of one or more layers.

17. The package of claim 16 wherein the first and second ground planes shield the circuitry in the first, second and third sets of layers from the other layers.

18. The package of claim 15 further comprising antenna feed points embedded in one or more of the second set of layers of the substrate.

* * * * *